(12) United States Patent
Haas et al.

(10) Patent No.: US 12,446,203 B2
(45) Date of Patent: Oct. 14, 2025

(54) SYSTEM FOR DETERMINING CONTAMINATION COEFFICIENTS AND/OR DEGREES OF CONTAMINATION IN PARTICULAR DURING THE REFLOW SOLDERING OF PRINTED CIRCUIT BOARDS, AND ASSOCIATED EVALUATION UNIT

(71) Applicant: ERSA GmbH, Wertheim (DE)

(72) Inventors: Michael Haas, Schollbrunn (DE); Benedict Fleischmann, Neubrunn (DE); Harald Grumm, Ottobrunn (DE); Lukas Thanhäuser, Würzburg (DE)

(73) Assignee: ERSA GmbH, Wertheim (DE)

( * ) Notice: Subject to any disclaimer, the term of this patent is extended or adjusted under 35 U.S.C. 154(b) by 334 days.

(21) Appl. No.: 18/201,552

(22) Filed: May 24, 2023

(65) Prior Publication Data

US 2024/0138134 A1 Apr. 25, 2024
US 2024/0237322 A9 Jul. 11, 2024

(30) Foreign Application Priority Data

Jun. 1, 2022 (DE) ...................... 10 2022 113 851.8

(51) Int. Cl.
*H05K 13/08* (2006.01)
*H05K 5/00* (2025.01)
*H05K 13/04* (2006.01)

(52) U.S. Cl.
CPC ....... *H05K 13/0817* (2018.08); *H05K 5/0018* (2022.08); *H05K 13/0465* (2013.01); *H05K 13/085* (2018.08); *H05K 13/0895* (2018.08)

(58) Field of Classification Search
CPC ............ H05K 13/0817; H05K 5/0018; H05K 13/0465; H05K 13/085; H05K 13/0895; H05K 1/181; H05K 1/0269; H05K 1/0306; H05K 1/111; H05K 1/141; H05K 3/34; H05K 3/3421; H05K 3/3494; G06N 20/00; G06F 18/241; B23K 1/0016; B23K 1/008; B23K 2101/42
See application file for complete search history.

(56) References Cited

U.S. PATENT DOCUMENTS

| 10,667,387 | B2* | 5/2020 | Riel | H05K 3/3421 |
| 11,618,634 | B2* | 4/2023 | Schmitz | B65G 43/00 |
| | | | | 700/228 |
| 2004/0128107 | A1* | 7/2004 | Ryu | F15B 21/041 |
| | | | | 702/183 |

(Continued)

FOREIGN PATENT DOCUMENTS

| DE | 19518804 A1 | 12/1995 |
| DE | 10311822 A1 | 10/2004 |

(Continued)

OTHER PUBLICATIONS

Examination report of priority application DE102022113851.8, dated Dec. 16, 2022. pp. 1-12.

*Primary Examiner* — Michael S Osinski
(74) *Attorney, Agent, or Firm* — BOND, SCHOENECK & KING, PLLC; George R. McGuire

(57) ABSTRACT

A system for determining a degree of contamination of production units of a production line for the printing, equipping and reflow soldering of printed circuit boards, and evaluation unit.

19 Claims, 1 Drawing Sheet

(56) References Cited

U.S. PATENT DOCUMENTS

| | | | | |
|---|---|---|---|---|
| 2008/0052435 | A1* | 2/2008 | Norwood | H05K 7/1467 |
| | | | | 710/301 |
| 2013/0314885 | A1* | 11/2013 | Ji | H05K 3/305 |
| | | | | 156/297 |
| 2013/0342150 | A1* | 12/2013 | Ozaki | F16H 57/0476 |
| | | | | 318/490 |
| 2014/0369017 | A1* | 12/2014 | Jeanneteau | H05K 1/181 |
| | | | | 361/803 |
| 2016/0240130 | A1* | 8/2016 | Nishimura | G09G 3/006 |
| 2019/0219394 | A1* | 7/2019 | Lin | G01C 19/5726 |
| 2021/0127498 | A1* | 4/2021 | Kaess | H05K 3/341 |
| 2021/0237184 | A1* | 8/2021 | Zenou | H05K 3/3478 |
| 2021/0267067 | A1* | 8/2021 | Gilan | H05K 13/0469 |
| 2022/0067912 | A1* | 3/2022 | Zhang | B65G 17/12 |
| 2023/0142133 | A1* | 5/2023 | Haas | B23K 1/012 |
| | | | | 219/85.1 |
| 2023/0144831 | A1* | 5/2023 | Miyagi | H02P 8/34 |
| | | | | 318/696 |
| 2023/0243780 | A1* | 8/2023 | Ohtsu | H01L 21/02041 |
| | | | | 430/311 |
| 2024/0064897 | A1* | 2/2024 | Zenou | H05K 13/046 |
| 2024/0261890 | A1* | 8/2024 | Luedi | B23K 26/38 |
| 2024/0286198 | A1* | 8/2024 | Reisch | B22F 10/25 |

FOREIGN PATENT DOCUMENTS

| | | |
|---|---|---|
| DE | 19903826 B4 | 3/2006 |
| DE | 102018212617 A1 | 1/2020 |
| DE | 102020105185 A1 | 9/2021 |
| EP | 3306424 B1 | 8/2019 |
| JP | H09201953 A | 8/1997 |
| WO | 2021/250989 A1 | 12/2021 |

\* cited by examiner

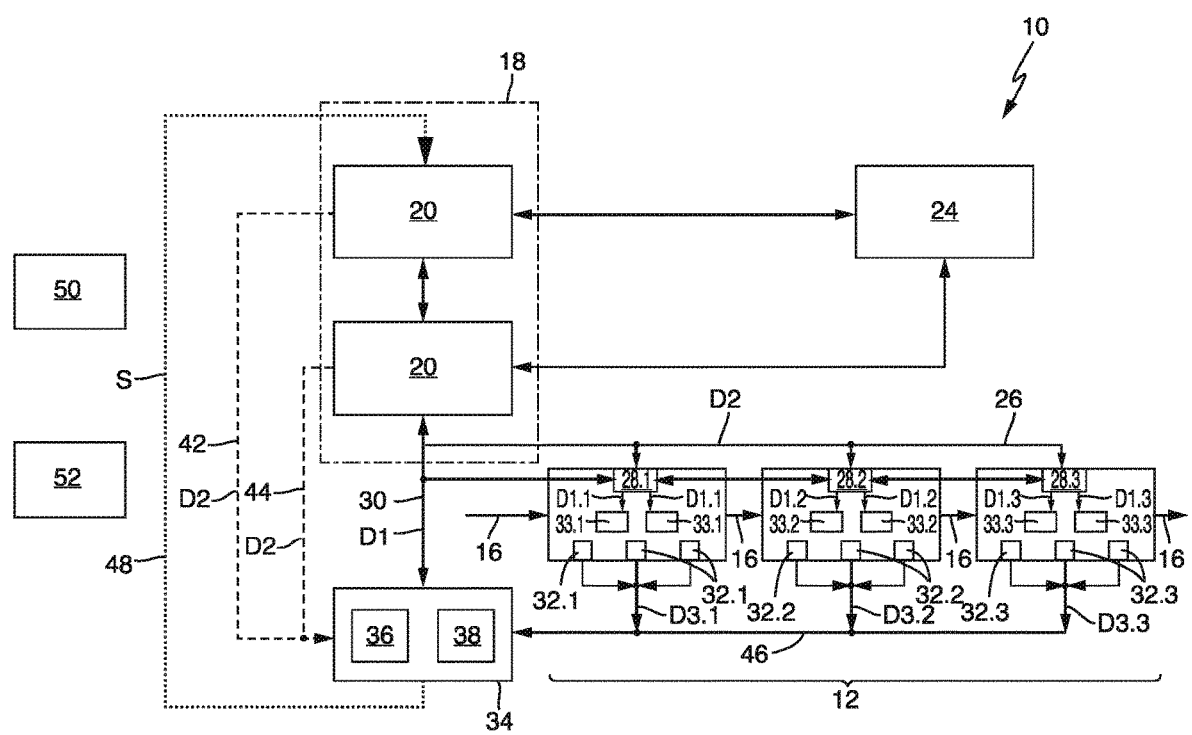

SYSTEM FOR DETERMINING CONTAMINATION COEFFICIENTS AND/OR DEGREES OF CONTAMINATION IN PARTICULAR DURING THE REFLOW SOLDERING OF PRINTED CIRCUIT BOARDS, AND ASSOCIATED EVALUATION UNIT

CROSS-REFERENCE TO RELATED APPLICATION

The present application claims priority to German Application No. 10 2022 113 851.8, filed Jun. 1, 2022, the entirety of which is hereby incorporated by reference.

BACKGROUND

The invention relates to a system for determining contamination coefficients and/or degrees of contamination during the printing, equipping, inspection and reflow soldering of printed circuit board products in a production line.

In the following, products or printed circuit board products are understood to mean, in particular, circuit boards or printed circuit boards which are provided and soldered by means of electrical components. Circuit boards comprise a plurality of individual printed circuit boards, which are separated from a larger printed circuit board or circuit board after they have been equipped and soldered.

Production lines for the printing, equipping, inspection and reflow soldering of such products and associated production planning units are known from the prior art. Thus, for example, DE 10 2020 105 185 A1 presents such a production line with individual production units, including a reflow soldering unit.

Reflow soldering units can be used to solder what are known as SMD components (surface-mounted devices) onto the surface of printed circuit boards by means of solder paste. The soldering paste, which is in particular a mixture of metal solder granules, flux and pasty components, is applied or printed onto the surface of the printed circuit boards for reflow soldering. Subsequently, the components to be soldered are placed into the soldering paste. In the reflow soldering process, the material to be soldered, i.e., the assembly consisting of a printed circuit board, soldering paste and components to be soldered, is preheated along the process channel in a preheating zone, and heated in a soldering zone to a temperature above the melting point of the soldering paste. As a result, the soldering paste melts, and the soldering joints are formed. In a cooling zone, if one is present, the soldering material is cooled until the melted solder solidifies before being removed from the reflow soldering apparatus.

The individual production units of a production line each have actuators and a dedicated production control unit for generating control data for controlling their respective actuators.

Furthermore, it is known to provide a production planning unit which is configured to generate production data for soldering orders of products and to at least partially communicate the generated production data to the individual production control units.

The individual production units can have sensors for monitoring state changes, wherein the sensors are configured to generate sensor data as a function of state changes.

The individual production units are subject to different degrees of contamination and different degrees of wear. Furthermore, the individual production units are subject to different maintenance intervals. In order to be able to operate the production line functionally reliably, cleaning and maintenance operations must be carried out comparatively frequently, which leads to comparatively long downtimes and thus to a non-optimal utilization of the production line.

SUMMARY OF THE INVENTION

The object of the present invention is to propose a system with which the downtimes can be minimized and the machine utilization can be optimized. Overall, production lines are to be operated more efficiently.

This object is achieved by a system for determining a contamination coefficient of products to be soldered and/or a degree of contamination of production units of a production line for soldering products.

Such a system therefore provides an evaluation unit comprising a controller and a memory. At least for one production unit, the production data of the production planning unit, the control data of the production control units and/or the sensor data of the sensors provided on or in the production units are transmitted to the controller of the evaluation unit. In particular, it is conceivable that the production data, the control data and/or the sensor data of only one production unit, in particular a reflow soldering unit, are transmitted to the evaluation unit. The reflow soldering unit is subject to particularly high contamination and accordingly requires many cleaning and maintenance intervals.

The data can be transmitted directly or indirectly, for example via bus systems, networks, nodes and/or other control units.

The evaluation unit is configured such that its memory stores commands which, when they are processed by its controller, cause the controller, on the basis of the production data generated by the production planning unit, the control data generated by the respective production control unit and/or the sensor data generated by at least a plurality of sensors
  to determine the contamination coefficient of the products and/or of the soldering order and/or
  to determine the degree of contamination of at least one of the production units and/or of at least one function of a production unit.

The contamination coefficient thus indicates what contamination is introduced by the machining of a specific product or the processing of a specific soldering order. The contamination coefficient is therefore based on the respective product or the respective soldering order and can be understood as a contamination coefficient of the respective product or of the respective soldering order which is specific to the product or soldering order, respectively. The degree of contamination, on the other hand, indicates the level of contamination to which one or a plurality of production units, or at least one function of a production unit, are subject as a result of the machining of a specific product or the processing of a specific soldering order. The degree of contamination therefore relates to the specific contamination of the one or a plurality of respective production units or the functions thereof during the machining of a specific product or during the processing of a specific soldering order.

Furthermore, a control algorithm is executed in order to generate control signals representing the contamination coefficient and/or the degree of contamination.

Such a system has the advantage that control signals are provided which represent the contamination coefficient, in particular of the products which form the basis of the respective soldering order, and/or the degree of contamination, in particular of at least one production unit.

Any necessary measures can be derived from the control signals or if no measures are to be derived, the respective production line can continue to be operated without interruption. With such a system, therefore, the efficiency of the production line can be increased.

Furthermore, it is advantageous if a database is provided in which in particular evaluated production data, evaluated control data, evaluated sensor data, contamination coefficients of products or previously processed soldering orders, degrees of contamination of at least one function of a production unit and/or of at least one production unit are stored as database data. The respective contamination coefficient and/or the respective degree of contamination can then also be determined on the basis of the database data. The database can in particular be integrated into the evaluation unit or be connected to the evaluation unit via a cloud connection, for example. By including the database data, the database is increased and more precise predictions can be made for new, previously unprocessed soldering orders with associated products.

The respective contamination coefficient and/or the respective degree of contamination can also be determined by the evaluation unit being further configured such that the memory stores commands which, when processed by the controller, cause the controller to:

evaluate the production data generated by the production planning unit, the control data generated by the respective production control unit, the sensor data generated by at least a plurality of sensors, and/or the database data, classify and select, on the basis of the evaluated production data, the evaluated control data, the evaluated sensor data and/or the database data a contamination coefficient of the respective products of the soldering order and/or a degree of contamination of at least one function of a production unit and/or of at least one of the production units, and execute a control algorithm in order to generate control signals representing the contamination coefficient and/or the degree of contamination of individual or all production units.

In this case, it is particularly advantageous if the evaluation unit is configured such that the classification and selection is effected by means of at least one classification algorithm. In particular, a classification algorithm is based on machine learning and uses, in particular, artificial intelligence (AI) technology, which includes various training and/or boosting techniques.

A classification algorithm is, for example, an algorithm for machine learning. The classification algorithm has been trained, for example, before use in the system for determining the contamination coefficient and/or the degree of contamination, to classify the contamination coefficient and/or the degree of contamination based on training data, in particular comprising control data, production data, sensor data and, if applicable, database data. Machine learning comprises, for example, supervised, unsupervised and reinforcement learning techniques. For example, generative adversarial networks are used. Generative adversarial networks are algorithms for unsupervised learning.

When used in the system, the algorithm classifies the contamination coefficient and/or the degree of contamination on the basis of the received control data, production data, sensor data and, if applicable, database data.

The classification algorithm can be further improved during use in the system.

The evaluation unit can comprise a linear classifier which makes classification decisions based on the value of a linear combination of the input data features. The linear classifier can in particular comprise a Fisher linear discriminant, a logistic regression classifier, a Naive Bayes classifier, a perceptron classifier and/or a support vector machine, and/or another classifier.

The evaluation unit can also comprise a nonlinear classifier. When a non-linear classifier is used, artificial neural networks, generative adversarial networks, support vector machines, k-nearest neighbor, Gaussian mixture models, Naive Bayes, decision trees, and RBF classifiers or the like can be used. The aim is to create an "intelligent active contamination coefficient or degree of contamination prediction" which is dependent in particular on the production data, the control data and the sensor data.

Furthermore, it is advantageous if the evaluation unit and the production planning unit are further designed in such a way that the control signals are transmitted to the production planning unit and that the production planning unit creates production data for soldering orders as a function of the control signals. In this way, upcoming, future soldering orders can be selected in such a way that it is ensured that no cleaning or maintenance is carried out on the production units during the future soldering orders, or that cleaning or maintenance is carried out at a defined time. The efficiency of the processing line can also be increased thereby.

Furthermore, it is advantageous if the evaluation unit and/or the production planning unit are further configured such that the evaluation unit and/or the production planning unit determines future cleaning and maintenance intervals of the individual production units and/or the production line as a function of the control signals. This can ensure that cleaning and maintenance work only takes place when it is actually required. The efficiency of the processing line can also be increased thereby.

Furthermore, it is conceivable that a display unit is provided which communicates with the evaluation unit and/or the production planning unit, wherein the respective contamination coefficient and/or respective degrees of contamination are displayed on the display unit. In particular, the respective actual degree of contamination of the individual production units can be displayed. Furthermore, it is conceivable that a contamination coefficient of an already processed or one or a plurality of future soldering orders is also displayed. Furthermore, it is also conceivable that a future degree of contamination of the individual production units is displayed, which is present when a future soldering order is processed. As a result, in particular, a machine operator is able to visualize the respective and/or future degree of contamination and when cleaning and maintenance intervals occur. Information about the contamination of the entire system is also possible.

Furthermore, it is advantageous if the production units are at least formed by a printer unit, an equipping unit and a reflow soldering unit. The printer unit is configured to print the printed circuit boards with solder paste and has a print control unit as a production control unit for generating printer control data. The equipping unit is used to equip the printed circuit boards with electrical or electronic components, wherein the equipping unit has an equipping control unit as a production control unit for generating equipping control data. The reflow soldering unit is used to solder the components to the printed circuit boards, wherein the reflow soldering unit has a reflow soldering control unit as a production control unit for generating reflow soldering control data. A production unit can also be formed by an inspection unit for optically inspecting soldering joints.

It has been shown that, in particular when printer control data, equipping control data and reflow soldering control data are included in the determination, evaluation, classification and/or selection of the degree of contamination, a particularly favorable contamination coefficient and degree of contamination prediction can be made.

It has further been shown that it is advantageous if the production data comprise information about the dimensions of the printed circuit boards, the material of the printed circuit boards, the number of printed circuit boards and/or the type of components to be placed. Consequently, it can be derived from the production data which use the production line is ultimately subject to.

The printer control data can in particular comprise information about the open area and/or thickness of the printing stencil, the type and properties of the solder paste, the solder paste consumption, the number of printing operations, and/or the type and number of inspections already carried out or still to be carried out. In particular, it is possible to infer from the consumption of the solder paste what degree of use the printer unit is subject to.

Furthermore, it is advantageous if the equipping control data comprise information about the number of electrical or electronic components that have been equipped, about the type, size and weight of the components, and/or about the type and amount of a flux and/or an adhesive. A degree of use of the equipping unit can be inferred from these data.

It is furthermore advantageous if the reflow soldering control data comprise information about temperatures (temperature profiles) prevailing in the reflow soldering unit, about the number of printed circuit boards passing through the reflow soldering unit, about the throughput rate of the printed circuit boards and/or about the oxygen concentration and/or protective gas concentration in the reflow soldering unit.

Furthermore, it is advantageous if the printer unit comprises print sensors which comprise information about the filling capacity and/or the solder paste consumption, about the amount of cleaning material available, in particular nonwoven cleaning material, for cleaning the printing stencil, and/or about the consumption of electrical energy.

Furthermore, it is advantageous if the equipping unit comprises equipping sensors which comprise information about the gripping force of a gripping head for handling the electrical or electronic components, about the speed and/or the acceleration of the gripping head, and/or the consumption of electrical energy.

It is particularly advantageous if the reflow soldering unit comprises reflow soldering sensors which supply information about the filling capacity of available protective gas, about the consumption of protective gas, the state of one or a plurality of process-gas-filtering filter media, temperatures or temperature profiles prevailing in the reflow soldering unit, pressure differentials or pressure differential profiles prevailing in the reflow soldering apparatus, process gas flows present in the reflow soldering apparatus, about transport rates of the printed circuit boards through the reflow soldering unit, about processes taking place in the reflow soldering unit, for example processes for changing temperature profiles or for initiating pyrolysis, and/or about the consumption of electrical energy.

It is further advantageous if, when an inspection unit is provided, the system comprises one or a plurality inspection sensors in or on the inspection unit which generate sensor data comprising information about the amount of solder paste printed, the number and volume of components that have been equipped, and/or the use of additional materials on the assembly.

It has been shown that, in particular, the information generated by the reflow soldering sensors is given particular consideration in the determination, evaluation, classification and/or selection, since, out of the individual production units, the reflow soldering unit is particularly susceptible to contamination and is thus maintenance-intensive.

Furthermore, it is advantageous if one of the production planning unit comprises a production planning unit and one or a plurality of line control units for controlling one or a plurality of production lines. The production planning unit plans soldering orders, supplies the line control units with corresponding data and instructs them to process the soldering orders. Furthermore, it is conceivable that the production planning unit, or the production planning unit thereof, communicates with a superordinate production control system.

The evaluation unit can in particular be designed as a separate unit which is supplied with production data from the production planning unit, control data from the production control units and further sensor data from the sensors. The evaluation unit can also communicate via the interface with a database in which the database data are stored and take the database data into account when determining the respective contamination coefficient or the respective degree of contamination. As already described, the respective contamination coefficient or the respective degree of contamination can also be determined via an evaluation, classification and selection, in particular by means of artificial intelligence or machine learning.

BRIEF DESCRIPTION OF THE DRAWINGS

Further details and advantageous embodiments of the invention can be found in the following description, on the basis of which an exemplary embodiment of the invention is described and explained in more detail.

FIG. 1 shows a schematic representation of a system 10 according to the invention.

DETAILED DESCRIPTION

The system 10 comprises a production line 12 for the printing, equipping and reflow soldering of products in the form of circuit boards or printed circuit boards. The production line 12 comprises various production units 14, wherein a production unit 14.1 in the form of a print unit, a production unit 14.2 downstream of the production unit 14.1 and in the form of an equipping unit, and a production unit 14.3 downstream of the production unit 14.2 and in the form of a reflow soldering unit are provided in FIG. 1. It is conceivable that further production units 14 are provided in the production line 12, such as an input station, a marking station for marking the printed circuit boards, a solder paste inspection machine, an output station and/or a printed circuit board buffer.

The products are transported along a transport direction 16 through the production line 12.

The system 10 further comprises a production planning unit 18, which includes a production planning unit 20 and a line control unit 22 for controlling the line 12. The production planning unit 20 communicates soldering orders to the line control unit 22. It is conceivable that, in addition to the line control unit 22 shown, further line control units not shown are provided for further, parallel production lines.

Furthermore, a superordinate production control system 24 is shown which communicates with the production planning unit 18 or the production planning unit 20 and the line control unit 22.

To control the individual production units 14, that is to say according to FIG. 1 the printer unit 14.1, the equipping unit 14.2 and the reflow soldering unit 14.3, production data D2 are generated by the production planning unit 18 or the line control unit 22 thereof, which production data are supplied via a production data line 26 to the production units 14.1 to 14.3. The production units 14.1 to 14.3 each provide a dedicated production control unit 28.1, 28.2 and 28.3. The individual production control units 28.1, 28.2 and 28.3 can be networked with one another and with the production planning unit 18 or the line control unit 22 via a communication system 30. The communication system 30 can be based, for example, on a Hermes Standard (IPC-Hermes-9852).

The individual production units 14.1 to 14.3 each have actuators 33, wherein the production unit 14.1 has two actuators 33.1, the production unit 14.2 has two actuators 33.2 and the production unit 14.3 has two actuators 33.3. The respective actuators 33 are each controlled by the associated production control units 28.1 to 28.3 by means of control data D1.

The individual production units 14.1 to 14.3 each provide sensors 32, wherein the production unit 14.1 comprises three sensors 32.1, the production unit 14.2 comprises three sensors 32.2, and the production unit 14.3 comprises three sensors 32.3. The sensors 32.1 to 32.3 each communicate with the production control unit 28.1, 28.2 and 28.3 assigned to the respective production unit 14.1, 14.2 and 14.3 via communication channels not shown.

Furthermore, an evaluation unit 34 is provided which comprises a controller 36 and a memory 38. As is clear from FIG. 1, the sensor data D3 detected by the sensors 32 is transmitted to the evaluation unit 34 via a communication line 46 either directly, as is shown in FIG. 1, or indirectly via the respective production control unit 28.1 to 28.3 or via the system 30. Accordingly, production data D2 is transmitted to the evaluation unit 34 from the production planning unit 18, or from the production planning unit 20 thereof and line control unit 22, via communication lines 42 and 44.

As can further be seen from FIG. 1, the control data D1 is transmitted to the evaluation unit 34 in particular via the communication system 30. Accordingly, the production data D2 generated in the production planning unit 18, or the production planning unit 20 thereof and line control unit 22, is transmitted to the evaluation unit 34 via the channels 42, 44. In addition, the sensor data D3 is also transmitted to the evaluation unit 34 from the individual sensors 32.1 to 32.3 via, in particular, the channel 46. The transmission of the control data D1, the production data D2 and the sensor data D3 to the evaluation unit 34 is such that this data is fed to the controller 36.

The evaluation unit 34 is further configured such that the memory 38 stores commands which, when processed by the controller 36, cause the controller 36 to evaluate control data D1, the production data D2 and/or the sensor data D3 and to determine a contamination coefficient of the products or of the processed soldering order and a degree of contamination of the respective production units 14.1 to 14.3 from the evaluated control data D1, evaluated production data D2 and evaluated sensor data D3.

The determination can be effected, in particular, by means of classifying and selecting the contamination coefficient or the degree of contamination, with statistical classification algorithms preferably being employed which use artificial intelligence including training and/or boosting techniques.

The evaluation unit 34, or the controller 36 thereof, is also configured such that a control algorithm is executed in order to generate control signals S representing the contamination coefficient or the degree of contamination. The control signals S are sent to the production planning unit 18 or the production planning unit 20 thereof via a channel 48.

In this case, the production planning unit 18 is further configured such that production data D2 is generated as a function of the control signals S. Depending on the determined contamination coefficients and degrees of contamination, production planning can therefore be effected in such a way that soldering orders are processed which are possible without cleaning or maintenance work taking place during the processing of the soldering order.

Furthermore, it is advantageous if future cleaning and maintenance intervals of the individual production units 14.1 to 14.3 are determined as a function of the control signals S. Depending on the soldering order to be processed and the expected workload, cleaning and maintenance intervals can therefore be determined and specified.

FIG. 1 also shows a display unit 50 which communicates with the evaluation unit 34 and/or with the production planning unit 18 via communication channels not shown. In particular, the degrees of contamination of the individual production units can be displayed on the display unit 50. Furthermore, it is conceivable that contamination coefficients of the most recently processed soldering orders or future soldering orders and/or future cleaning and maintenance intervals are displayed on the display unit 50.

The control data D1 can be, in particular, printer control data D1.1 generated by the production control unit 28.1. This can comprise information about the area and/or thickness of the printing stencil to be used, about the type and properties of the solder paste, about the solder paste consumption, about the number of printing operations and/or about the type and number of an inspection that has taken place or is to take place.

The control data D1 can also comprise equipping control data D1.2 of the equipping control unit 28.2. The equipping control data D1.2 can comprise in particular information about the number of components, the type, size and weight of the components, and/or the type and amount of a flux and/or an adhesive.

The control data can also comprise reflow soldering control data D1.3 of the production control unit 28.3, the reflow soldering control data D1.3 can comprise information about temperatures or temperature profiles prevailing in the reflow soldering unit, about the number of printed circuit boards which are guided through the reflow soldering unit, about the throughput rate of the printed circuit boards, and/or about the oxygen and/or protective gas concentration in the reflow soldering unit. In addition, the control data can comprise information about the system configuration, in particular about the type and number of zones and about specific equipment, in particular for cleaning the zones.

The production data D2 generated by the production planning unit 18 can in particular comprise information about the dimensions of the printed circuit boards, the material of the printed circuit board, the number of printed circuit boards, and/or the type of components to be placed onto the printed circuit boards.

The sensor data D3.1—generated by the sensors 32.1 of the print unit 14.1—of the printer sensors 30.1 can comprise information about the filling capacities and/or the consumption of solder paste, about the amount of cleaning agent present for cleaning the printing stencil, and/or about the consumption of electrical energy.

The sensor data D3.2 acquired by the sensors 32.2 of the equipping unit 14.2 can comprise information about the gripping force of a gripping head for handling the components, the speed and/or acceleration of the gripping head, and/or the consumption of electrical energy.

The sensor data D3.3 detected by the reflow soldering sensors 32.3 comprise, in particular, information about the filling capacity of available protective gas, the consumption of protective gas, the state of one or a plurality of process-gas-filtering filter media, prevailing temperatures, prevailing pressure differentials, process gas flows present, the transport speeds of the printed circuit boards in the reflow soldering unit 14.3, processes occurring in the reflow soldering unit 14.3, and/or the consumption of electrical energy in the reflow soldering unit 14.3.

The system 10 is therefore used to create and process soldering orders and to manufacture products. In doing so, the evaluation unit 24 evaluates the production data D2, the control data D1 and/or the sensor data D3. In particular, by classifying and selecting the evaluated production data, the evaluated control data, and/or the evaluated sensor data, a contamination coefficient for the processed soldering order or its products and/or a degree of contamination of the production line 12 or of the production units 14, which results from the soldering order processed in the production line, is determined.

The contamination coefficient can be specified in particular as a dimensionless number. In particular, it can further specify, in terms of a percentage amount, how close the production line, individual production units and/or a function of an individual production unit is to necessary maintenance per printed circuit board soldered in this way or per associated soldering order.

The control signals S then represent the respective contamination coefficient and/or the respective degree of contamination.

If a future soldering order is to be processed, for which contamination coefficients and/or degrees of contamination have already been determined, it is possible to refer to previous data from a corresponding soldering order that has already been performed or from corresponding products that have already been manufactured.

As a result, if a corresponding product with possibly deviating quantities is to be manufactured in the future, a contamination coefficient of the product and the degree of contamination of the production unit can be classified and selected on the basis of the evaluated data. In particular, if enough repeating products are produced whose contamination coefficients are already known, the planning of maintenance and thus production planning can always be improved.

If enough data has been collected, the contamination coefficients and degrees of contamination determined in the past can be correlated with the production data D2 and control data D1 in order to determine a contamination coefficient or a degree of contamination for future soldering orders by classification and selection.

In this way, in particular for a new soldering job that has not yet been carried out or for products to be manufactured for which no previous data is available yet, a contamination coefficient or a degree of contamination can be determined in advance by suitable classification and selection. The respective contamination coefficients or degrees of contamination determined in advance can subsequently be compared with the actually determined contamination coefficients or degrees of contamination and thus the determination of the contamination coefficient or the degree of contamination can be made more precise.

It can furthermore be provided that a database 52 with contamination coefficients for defined soldering orders or degrees of contamination of the production units after the processing of the soldering order can be accessed via a cloud connection, for example. As a result, the database increases when determining, classifying and selecting, and more precise predictions can be made for new, not yet processed soldering orders and products.

Furthermore, as soon as production planning is available, a maintenance time can be estimated. The more products that have already been manufactured beforehand on the line or stored in the database 52, the more accurate this estimate becomes. By appropriately evaluating, selecting and classifying the data, a prediction can also be created if no contamination coefficients are known to date for the products to be manufactured.

As a result of the evaluation unit 34 and the described evaluation of the control data D1, the production data D2 and the sensor data D3, and by the subsequent classification and selection of a contamination coefficient and/or degree of contamination on the basis of the evaluated control data D1, production data D2 and sensor data D3, a contamination coefficient when the soldering order is carried out and a degree of contamination in particular of the individual production units 14.1 to 14.3 can therefore be determined. Furthermore, a contamination coefficient of future soldering orders or a future degree of contamination during processing of the soldering order can also be determined. In summary, a contamination coefficient and degree of contamination prediction can thereby be provided, allowing the production line 12 to be operated with comparatively little cleaning and maintenance, and thus efficiently.

What is claimed is:

1. A system for determining at least one of a contamination coefficient of products to be soldered and/or a degree of contamination of production units of a production line for soldering products,
the production units each comprising actuators and a dedicated production control unit for generating control data for controlling their respective actuators,
wherein a production planning unit is provided which is configured to generate production data for soldering orders for soldering the products and to communicate the generated production data at least partially to the individual production control units,
wherein the production units comprise sensors for monitoring state changes, and
wherein the sensors are configured to generate sensor data as a function of state changes,
wherein an evaluation unit having a controller and a memory is provided,
wherein the production data, the control data and the sensor data of at least one production unit are transmitted to the controller of the evaluation unit, and
wherein the evaluation unit is configured such that its memory stores commands which, when processed by its controller, cause the controller:
on the basis of the production data generated by the production planning unit, the control data generated by the respective production control unit and the sensor data generated by at least a plurality of sensors
to determine the contamination coefficient of the products and/or of the soldering order and/or
to determine the degree of contamination of at least one of the production units and/or of at least one function of a production unit,
and
to execute a control algorithm in order to generate control signals representing the contamination coefficient and/or the degree of contamination.

2. The system as claimed in claim 1, wherein a database is provided in which the following are stored as database data:
evaluated production data, evaluated control data, evaluated sensor data of previous soldering orders,
contamination coefficients of previously manufactured products or previously processed soldering orders, and/or
degrees of contamination of at least one of the production units and/or of at least one function of a production unit,
wherein the respective contamination coefficient and/or the respective degree of contamination is also determined on the basis of the database data.

3. The system as claimed in claim 1, wherein the respective contamination coefficient and/or the respective degree of contamination is determined by the evaluation unit being further configured such that its memory stores commands which, when processed by its controller, cause the controller to:
evaluate the production data generated by the production planning unit, the control data generated by the respective production control unit, the sensor data generated by at least a plurality of sensors, and/or the database data,
classify and select, on the basis of the evaluated production data, the evaluated control data, the evaluated sensor data, the database data, and/or the evaluated database data
the contamination coefficient of the products and/or of the soldering order, and/or
the degree of contamination of at least one of the production units and/or of at least one function of a production unit
and
execute a control algorithm in order to generate control signals representing the contamination coefficient and/or the degree of contamination.

4. The system according to claim 1, wherein the evaluation unit is configured such that the contamination coefficient and/or the degree of contamination is classified and selected by means of statistical classification algorithms.

5. The system as claimed in claim 1, wherein the evaluation unit and the production planning unit are further configured such that the control signals are transmitted to the production planning unit and that the production planning unit creates production data for soldering orders as a function of the control signals.

6. The system according to claim 1, wherein the evaluation unit and/or the production planning unit are further configured such that the evaluation unit and/or the production planning unit determines future cleaning and maintenance intervals of the individual production units and/or of the production line as a function of the control signals.

7. The system according to claim 1, wherein a display unit communicating with the evaluation unit and/or the production planning unit is provided, and wherein contamination coefficients of the products, degrees of contamination of individual production units and/or of the production line and/or future cleaning and maintenance intervals are displayed on the display unit.

8. The system according to claim 1, wherein the production units are formed by at least:
a printer unit for printing the printed circuit boards with solder paste, wherein the printer unit has a print control unit as a production control unit for generating printer control data,
an equipping unit for equipping the printed circuit boards with components, wherein the equipping unit has an equipping control unit as a production control unit for generating equipping control data,
a reflow soldering unit for soldering the components onto the printed circuit boards, wherein the reflow soldering unit has a reflow soldering control unit as a production control unit for generating reflow soldering control data, and/or
an inspection unit for optically inspecting soldering joints.

9. The system as claimed in claim 8, wherein the evaluation unit is further configured such that its memory stores commands which, when processed by its controller, cause the controller to:
evaluate the printer control data generated by the print control unit, the equipping control data generated by the equipping unit, and/or the reflow soldering control data generated by the reflow soldering unit, and
classify and select a contamination coefficient and/or degree of contamination at least in part also on the basis of the evaluated printer control data, the evaluated equipping control data and/or the evaluated reflow soldering control data.

10. The system according to claim 1, wherein the production data comprises information about:
the dimensions of the printed circuit boards,
the material of the printed circuit board,
the number of printed circuit boards, and/or
the type of components to be placed onto the printed circuit boards.

11. The system according to claim 8, wherein, when a printer unit is provided, the control data comprises printer control data comprising information about:
the area and/or thickness of the printing stencil,
type and properties of the solder paste,
solder paste consumption,
the number of printing operations, and/or
type and number of inspections.

12. The system according to claim 8, wherein, when an equipping unit is provided, the control data comprise equipping control data comprising information about:
the number of components, and/or
type, size and weight of the components.

13. The system according to claim 8, wherein, when a reflow soldering unit is provided, the control data comprise reflow soldering control data comprising information about:
prevailing temperatures (temperature profiles),
the number of printed circuit boards,
the throughput rate of the printed circuit boards, the oxygen and/or protective gas concentration in the reflow soldering unit, and/or
the system configuration.

14. The system according to claim 8, wherein, when a printer unit is provided, the sensors comprise one or a plurality of printer sensors in or on the printer unit which generate sensor data comprising information about:

the filling capacity and/or consumption of the solder paste, the amount of cleaning material available for cleaning the printing stencil, and/or the consumption of electrical energy.

15. The system according to claim 8, wherein, when an equipping unit is provided, the sensors comprise one or a plurality of equipping sensors in or on the equipping unit which generate sensor data comprising information about:

the gripping force of a gripping head for handling the components, the speed and/or acceleration of the gripping head, and/or the consumption of electrical energy.

16. The system according to claim 8, wherein, when a reflow soldering unit is provided, the sensors comprise one or a plurality of reflow soldering sensors on or in the reflow soldering unit which generate sensor data comprising information about:

the filling capacity of available protective gas, the consumption of protective gas, the state of one or a plurality of process-gas-filtering filter media, prevailing temperatures, prevailing pressure differentials, process gas flows present, the transport rates of the printed circuit boards, processes taking place (pyrolysis), and/or the consumption of electrical energy.

17. The system according to 8, wherein, when an inspection unit is provided, the sensors comprise one or a plurality of inspection sensors in or on the inspection unit which generate sensor data comprising information about:

the amount of solder paste printed, the number and volume of equipped components, and/or the use of additional materials on the assembly.

18. The system according to claim 1, wherein the production planning unit comprises one or a plurality of line control units for controlling a plurality of production lines and/or a production planning unit for communicating with a superordinate production control system.

19. An evaluation unit for a system, comprising a controller and a memory, and an interface for transmitting production data of a production planning unit, control data of production control units and sensor data of sensors to the controller, wherein the evaluation unit is configured such that the memory stores commands which, when processed by the controller, cause the controller:

on the basis of the production data generated by the production planning unit, the control data generated by a respective production control unit and the sensor data generated by at least a plurality of sensors to determine the contamination coefficient of the products and/or of the soldering order and/or to determine the degree of contamination of at least one of the production units and/or of at least one function of a production unit and to execute a control algorithm in order to generate control signals representing the contamination coefficient and/or the degree of contamination.

\* \* \* \* \*